United States Patent
Arena-Foster et al.

(10) Patent No.: US 6,928,746 B2
(45) Date of Patent: Aug. 16, 2005

(54) DRYING RESIST WITH A SOLVENT BATH AND SUPERCRITICAL CO$_2$

(75) Inventors: Chantal J. Arena-Foster, Mesa, AZ (US); Allan Wendell Awtrey, Fort Worth, TX (US); Nicholas Alan Ryza, Austin, TX (US); Paul Schilling, Granite Bay, CA (US)

(73) Assignee: Tokyo Electron Limited, Tokyo (JP)

( * ) Notice: Subject to any disclaimer, the term of this patent is extended or adjusted under 35 U.S.C. 154(b) by 104 days.

(21) Appl. No.: 10/367,080

(22) Filed: Feb. 14, 2003

(65) Prior Publication Data

US 2004/0035021 A1 Feb. 26, 2004

Related U.S. Application Data

(60) Provisional application No. 60/357,756, filed on Feb. 15, 2002, and provisional application No. 60/358,622, filed on Feb. 20, 2002.

(51) Int. Cl.[7] .................................................. F26B 3/00
(52) U.S. Cl. ............................. 34/351; 34/78; 430/311
(58) Field of Search .............................. 34/76, 78, 79, 34/310, 351, 442; 118/715, 733; 134/147, 902; 427/96, 100; 210/490; 430/311, 322

(56) References Cited

U.S. PATENT DOCUMENTS

| | | |
|---|---|---|
| 2,439,689 A | 4/1948 | Hyde et al. |
| 2,617,719 A | 11/1952 | Stewart |
| 3,642,020 A | 2/1972 | Payne |
| 3,890,176 A | 6/1975 | Bolon |
| 3,900,551 A | 8/1975 | Bardoncelli et al. |
| 4,219,333 A | 8/1980 | Harris |
| 4,341,592 A | 7/1982 | Shortes et al. |
| 4,349,415 A | 9/1982 | DeFilippi et al. |
| 4,475,993 A | 10/1984 | Blander et al. |
| 4,749,440 A | 6/1988 | Blackwood et al. |

(Continued)

FOREIGN PATENT DOCUMENTS

| | | | |
|---|---|---|---|
| DE | 39 04 514 C2 | 8/1990 | ............ D06L/1/00 |
| DE | 40 04 111 C2 | 8/1990 | ............ D06L/1/00 |
| DE | 39 06 724 C2 | 9/1990 | ............ D06P/1/90 |
| DE | 39 06 735 C2 | 9/1990 | ............ D06L/3/00 |
| DE | 39 06 737 A1 | 9/1990 | ......... D06M/11/59 |
| DE | 44 29 470 A1 | 3/1995 | ............ D06P/5/04 |
| DE | 43 44 021 A1 | 6/1995 | ............ D06P/1/16 |
| EP | 0 283 740 A2 | 9/1988 | ............ C22B/3/00 |
| EP | 0 302 345 A2 | 2/1989 | ............ C22B/3/00 |
| EP | 0 370 233 A1 | 5/1990 | ............ C22B/3/00 |
| EP | 0 391 035 A2 | 10/1990 | ............ C23G/5/00 |
| EP | 0 518 653 B1 | 12/1992 | ............ D06L/1/02 |
| EP | 0 536 752 A2 | 4/1993 | ............ C11D/3/20 |
| EP | 0 572 913 A1 | 12/1993 | .......... B01D/11/02 |

(Continued)

OTHER PUBLICATIONS

US 6,001,133, 12/1999, DeYoung et al. (withdrawn)
US 6,486,282, 11/2002, Dammel et al. (withdrawn)
J.B. Rubin et al, "A Comparison of Chilled DI Water/Ozone and Co2–Based Supercritical Fluids as Replacements for Photoresist–Stripping Solvents", IEEE/CPMT Int'l Electronics Manufacturing Technology Symposium, 1998, pp. 308–314.
"Los Almos National Laboratory," Solid State Technology, pp. S10 & S14, Oct. 1998.

(Continued)

Primary Examiner—Stephen Gravini
(74) Attorney, Agent, or Firm—Haverstock & Owens LLP

(57) ABSTRACT

A method for drying an object, having a polymeric film, wherein the object is submerged in a rinse liquid. The object is removed from the rinse liquid and the object is placed in a solvent bath before a sufficient amount of the rinse liquid can evaporate from the object. The density of a solvent in the solvent bath depends on a direction of orientation of the polymeric film with respect to a force. The object is removed from the solvent bath. A drying process is performed.

26 Claims, 3 Drawing Sheets

U.S. PATENT DOCUMENTS

| | | | |
|---|---|---|---|
| 4,838,476 A | 6/1989 | Rahn | |
| 4,877,530 A | 10/1989 | Moses | |
| 4,879,004 A | 11/1989 | Oesch et al. | |
| 4,923,828 A | 5/1990 | Gluck et al. | |
| 4,925,790 A | 5/1990 | Blanch et al. | |
| 4,933,404 A | 6/1990 | Beckman et al. | |
| 4,944,837 A | 7/1990 | Nishikawa et al. | |
| 5,011,542 A | 4/1991 | Weil | |
| 5,013,366 A | 5/1991 | Jackson et al. | |
| 5,068,040 A | 11/1991 | Jackson | |
| 5,071,485 A | 12/1991 | Matthews et al. | |
| 5,091,207 A | 2/1992 | Tanaka | |
| 5,105,556 A | 4/1992 | Kurokawa et al. | |
| 5,158,704 A | 10/1992 | Fulton et al. | |
| 5,174,917 A | 12/1992 | Monzyk | |
| 5,185,058 A | 2/1993 | Cathey, Jr. | |
| 5,185,296 A | 2/1993 | Morita et al. | |
| 5,196,134 A | 3/1993 | Jackson | |
| 5,201,960 A | 4/1993 | Starov | |
| 5,213,619 A | 5/1993 | Jackson et al. | |
| 5,215,592 A | 6/1993 | Jackson | |
| 5,225,173 A | 7/1993 | Wai | |
| 5,236,602 A | 8/1993 | Jackson | |
| 5,237,824 A | 8/1993 | Pawliszyn | |
| 5,238,671 A | 8/1993 | Matson et al. | |
| 5,250,078 A | 10/1993 | Saus et al. | |
| 5,261,965 A | 11/1993 | Moslehi | |
| 5,266,205 A | 11/1993 | Fulton et al. | |
| 5,269,815 A | 12/1993 | Schlenker et al. | |
| 5,269,850 A | 12/1993 | Jackson | |
| 5,274,129 A | 12/1993 | Natale | |
| 5,285,352 A | 2/1994 | Pastore et al. | |
| 5,288,333 A | 2/1994 | Tanaka et al. | |
| 5,290,361 A | 3/1994 | Hayashida et al. | |
| 5,294,261 A | 3/1994 | McDermott et al. | |
| 5,298,032 A | 3/1994 | Schlenker et al. | |
| 5,304,515 A | 4/1994 | Morita et al. | |
| 5,306,350 A | 4/1994 | Hoy et al. | |
| 5,312,882 A | 5/1994 | DeSimone et al. | |
| 5,314,574 A | 5/1994 | Takahashi | |
| 5,316,591 A | 5/1994 | Chao et al. | |
| 5,320,742 A | 6/1994 | Fletcher et al. | |
| 5,328,722 A | 7/1994 | Ghanayem et al. | |
| 5,334,332 A | 8/1994 | Lee | |
| 5,334,493 A | 8/1994 | Fujita et al. | |
| 5,352,327 A | 10/1994 | Witowski | |
| 5,356,538 A | 10/1994 | Wai et al. | |
| 5,364,497 A | 11/1994 | Chau et al. | |
| 5,370,740 A | 12/1994 | Chao et al. | |
| 5,370,741 A | 12/1994 | Bergman | |
| 5,370,742 A | 12/1994 | Mitchell et al. | |
| 5,401,322 A | 3/1995 | Marshall | |
| 5,403,621 A | 4/1995 | Jackson et al. | |
| 5,403,665 A | 4/1995 | Alley et al. | |
| 5,417,768 A | 5/1995 | Smith, Jr. et al. | |
| 5,456,759 A | 10/1995 | Stanford, Jr. et al. | |
| 5,470,393 A | 11/1995 | Fukazawa | |
| 5,474,812 A | 12/1995 | Truckenmuller et al. | |
| 5,482,564 A | 1/1996 | Douglas et al. | |
| 5,486,212 A | 1/1996 | Mitchell et al. | |
| 5,494,526 A | 2/1996 | Paranjpe | |
| 5,500,081 A | 3/1996 | Bergman | |
| 5,501,761 A | 3/1996 | Evans et al. | |
| 5,514,220 A | 5/1996 | Wetmore et al. | |
| 5,522,938 A | 6/1996 | O'Brien | |
| 5,547,774 A | 8/1996 | Gimzewski et al. | |
| 5,550,211 A | 8/1996 | DeCrosta et al. | |
| 5,580,846 A | 12/1996 | Hayashida et al. | |
| 5,589,082 A | 12/1996 | Lin et al. | |
| 5,589,105 A | 12/1996 | DeSimone et al. | |
| 5,629,918 A | 5/1997 | Ho et al. | |
| 5,632,847 A | 5/1997 | Ohno et al. | |
| 5,635,463 A | 6/1997 | Muraoka | |
| 5,637,151 A | 6/1997 | Schulz | |
| 5,641,887 A | 6/1997 | Beckman et al. | |
| 5,653,045 A * | 8/1997 | Ferrell | 34/341 |
| 5,656,097 A | 8/1997 | Olesen et al. | |
| 5,665,527 A | 9/1997 | Allen et al. | |
| 5,676,705 A | 10/1997 | Jureller et al. | |
| 5,679,169 A | 10/1997 | Gonzales et al. | |
| 5,679,171 A | 10/1997 | Saga et al. | |
| 5,683,473 A | 11/1997 | Jureller et al. | |
| 5,683,977 A | 11/1997 | Jureller et al. | |
| 5,688,879 A | 11/1997 | DeSimone | |
| 5,700,379 A | 12/1997 | Biebl | |
| 5,714,299 A | 2/1998 | Combes et al. | |
| 5,725,987 A | 3/1998 | Combes et al. | |
| 5,726,211 A | 3/1998 | Hedrick et al. | |
| 5,730,874 A | 3/1998 | Wai et al. | |
| 5,736,425 A | 4/1998 | Smith et al. | |
| 5,739,223 A | 4/1998 | DeSimone | |
| 5,766,367 A | 6/1998 | Smith et al. | |
| 5,783,082 A | 7/1998 | DeSimone et al. | |
| 5,797,719 A | 8/1998 | James et al. | |
| 5,798,438 A | 8/1998 | Sawan et al. | |
| 5,804,607 A | 9/1998 | Hedrick et al. | |
| 5,807,607 A | 9/1998 | Smith et al. | |
| 5,847,443 A | 12/1998 | Cho et al. | |
| 5,866,005 A | 2/1999 | DeSimone et al. | |
| 5,868,856 A * | 2/1999 | Douglas et al. | 134/2 |
| 5,868,862 A | 2/1999 | Douglas et al. | |
| 5,872,061 A | 2/1999 | Lee et al. | |
| 5,872,257 A | 2/1999 | Beckman et al. | |
| 5,873,948 A | 2/1999 | Kim | |
| 5,881,577 A | 3/1999 | Sauer et al. | |
| 5,888,050 A | 3/1999 | Fitzgerald et al. | |
| 5,893,756 A | 4/1999 | Berman et al. | |
| 5,896,870 A | 4/1999 | Huynh et al. | |
| 5,900,354 A | 5/1999 | Batchelder | |
| 5,904,737 A | 5/1999 | Preston et al. | |
| 5,908,510 A | 6/1999 | McCullough et al. | |
| 5,928,389 A | 7/1999 | Jevtic | |
| 5,932,100 A | 8/1999 | Yager et al. | |
| 5,944,996 A | 8/1999 | DeSimone et al. | |
| 5,955,140 A | 9/1999 | Smith et al. | |
| 5,965,025 A | 10/1999 | Wai et al. | |
| 5,976,264 A | 11/1999 | McCullough et al. | |
| 5,980,648 A | 11/1999 | Adler | |
| 5,992,680 A | 11/1999 | Smith | |
| 5,994,696 A | 11/1999 | Tai et al. | |
| 6,005,226 A | 12/1999 | Aschner et al. | |
| 6,017,820 A | 1/2000 | Ting et al. | |
| 6,021,791 A | 2/2000 | Dryer et al. | 134/100.1 |
| 6,024,801 A | 2/2000 | Wallace et al. | |
| 6,037,277 A | 3/2000 | Masakara et al. | |
| 6,041,796 A * | 3/2000 | Berbel | 134/95.2 |
| 6,063,714 A | 5/2000 | Smith et al. | |
| 6,067,728 A | 5/2000 | Farmer et al. | |
| 6,099,619 A | 8/2000 | Lansbarkis et al. | |
| 6,100,198 A | 8/2000 | Grieger et al. | |
| 6,108,932 A * | 8/2000 | Chai | 34/245 |
| 6,110,232 A | 8/2000 | Chen et al. | |
| 6,114,044 A | 9/2000 | Houston et al. | |
| 6,128,830 A | 10/2000 | Bettcher et al. | |
| 6,140,252 A | 10/2000 | Cho et al. | |
| 6,149,828 A | 11/2000 | Vaartstra | |
| 6,171,645 B1 | 1/2001 | Smith et al. | |
| 6,200,943 B1 | 3/2001 | Romack et al. | |
| 6,216,364 B1 | 4/2001 | Tanaka et al. | |
| 6,224,774 B1 | 5/2001 | DeSimone et al. | |
| 6,228,563 B1 | 5/2001 | Starov et al. | |

| | | |
|---|---|---|
| 6,228,826 B1 | 5/2001 | DeYoung et al. |
| 6,232,238 B1 | 5/2001 | Chang et al. |
| 6,232,417 B1 | 5/2001 | Rhodes et al. |
| 6,239,038 B1 | 5/2001 | Wen |
| 6,242,165 B1 | 6/2001 | Vaartstra |
| 6,251,250 B1 | 6/2001 | Keigler |
| 6,255,732 B1 | 7/2001 | Yokoyama et al. |
| 6,270,531 B1 | 8/2001 | DeYoung et al. |
| 6,270,948 B1 | 8/2001 | Sato et al. |
| 6,277,753 B1 | 8/2001 | Mullee et al. |
| 6,284,558 B1 | 9/2001 | Sakamoto |
| 6,286,231 B1 | 9/2001 | Bergman et al. |
| 6,306,564 B1 | 10/2001 | Mullee |
| 6,319,858 B1 | 11/2001 | Lee et al. |
| 6,331,487 B2 | 12/2001 | Koch |
| 6,344,243 B1 | 2/2002 | McClain et al. |
| 6,358,673 B1 | 3/2002 | Namatsu |
| 6,361,696 B1 | 3/2002 | Spiegelman et al. |
| 6,367,491 B1 | 4/2002 | Marshall et al. |
| 6,380,105 B1 | 4/2002 | Smith et al. |
| 6,425,956 B1 | 7/2002 | Cotte et al. |
| 6,436,824 B1 | 8/2002 | Chooi et al. |
| 6,454,945 B1 | 9/2002 | Weigl et al. |
| 6,458,494 B2 | 10/2002 | Song et al. |
| 6,461,967 B2 | 10/2002 | Wu et al. |
| 6,465,403 B1 | 10/2002 | Skee |
| 6,485,895 B1 | 11/2002 | Choi et al. |
| 6,486,078 B1 | 11/2002 | Rangarajan et al. |
| 6,492,090 B2 | 12/2002 | Nishi et al. |
| 6,500,605 B1 | 12/2002 | Mullee et al. |
| 6,509,141 B2 | 1/2003 | Mullee |
| 6,537,916 B2 | 3/2003 | Mullee et al. ............... 438/692 |
| 6,558,475 B1 | 5/2003 | Jur et al. |
| 6,562,146 B1 | 5/2003 | DeYoung et al. |
| 6,635,565 B2 | 10/2003 | Wu et al. |
| 6,641,678 B2 | 11/2003 | DeYoung et al. |
| 6,764,552 B1 | 7/2004 | Joyce et al. .................... 134/3 |
| 2001/0019857 A1 | 9/2001 | Yokoyama et al. |
| 2001/0024247 A1 | 9/2001 | Nakata |
| 2001/0041455 A1 | 11/2001 | Yun et al. |
| 2001/0041458 A1 | 11/2001 | Ikakura et al. |
| 2002/0001929 A1 | 1/2002 | Biberger et al. |
| 2002/0055323 A1 | 5/2002 | McClain et al. |
| 2002/0074289 A1 | 6/2002 | Sateria et al. |
| 2002/0081533 A1 | 6/2002 | Simons et al. |
| 2002/0088477 A1 | 7/2002 | Cotte et al. |
| 2002/0098680 A1 | 7/2002 | Goldstein et al. |
| 2002/0106867 A1 | 8/2002 | Yang et al. |
| 2002/0112740 A1 | 8/2002 | DeYoung et al. |
| 2002/0112746 A1 | 8/2002 | DeYoung et al. |
| 2002/0115022 A1 | 8/2002 | Messick et al. |
| 2002/0117391 A1 | 8/2002 | Beam |
| 2002/0123229 A1 | 9/2002 | Ono et al. |
| 2002/0127844 A1 | 9/2002 | Grill et al. |
| 2002/0132192 A1 | 9/2002 | Namatsu |
| 2002/0141925 A1 | 10/2002 | Wong et al. |
| 2002/0142595 A1 | 10/2002 | Chiou |
| 2002/0150522 A1 | 10/2002 | Heim et al. |
| 2002/0164873 A1 | 11/2002 | Masuda et al. ............. 438/689 |
| 2003/0003762 A1 | 1/2003 | Cotte et al. |
| 2003/0008238 A1 | 1/2003 | Goldfarb et al. |
| 2003/0008518 A1 | 1/2003 | Chang et al. |
| 2003/0013311 A1 | 1/2003 | Chang et al. |
| 2003/0036023 A1 | 2/2003 | Moreau et al. |
| 2003/0047533 A1 | 3/2003 | Reid et al. |
| 2003/0106573 A1 | 6/2003 | Masuda et al. ............... 134/26 |
| 2003/0125225 A1 | 7/2003 | Xu et al. .................... 510/175 |
| 2003/0217764 A1 | 11/2003 | Masuda et al. ............... 134/26 |
| 2004/0087457 A1 | 5/2004 | Korzenski et al. .......... 510/177 |
| 2004/0103922 A1 | 6/2004 | Inoue et al. .................. 134/26 |
| 2004/0112409 A1 | 6/2004 | Schilling ..................... 134/26 |
| 2004/0177867 A1 | 9/2004 | Schilling ..................... 134/26 |

FOREIGN PATENT DOCUMENTS

| | | | | |
|---|---|---|---|---|
| EP | 0 620 270 A3 | 10/1994 | ............ | C11D/7/50 |
| EP | 0 679 753 B1 | 11/1995 | ............ | D06F/43/00 |
| EP | 0 711 864 B1 | 5/1996 | ............ | D06G/1/00 |
| EP | 0 726 099 A2 | 8/1996 | ............ | B08B/5/00 |
| EP | 0 727 711 A2 | 8/1996 | ............ | G03F/7/004 |
| EP | 0 822 583 A2 | 2/1998 | ........ | H01L/21/306 |
| EP | 0 829 312 A2 | 3/1998 | ............ | B08B/3/08 |
| EP | 0 836 895 A2 | 4/1998 | ............ | B08B/7/00 |
| JP | 60-192333 | 9/1985 | ........... | H01L/21/30 |
| JP | 1-045131 | 2/1989 | ........... | B01D/11/04 |
| JP | 1-246835 | 10/1989 | ......... | H01L/21/304 |
| JP | 2-209729 | 8/1990 | ......... | H01L/21/302 |
| JP | 2-304941 | 12/1990 | ............ | H01L/21/56 |
| JP | 7-142333 | 6/1995 | ......... | H01L/21/027 |
| JP | 8-186140 | 7/1996 | ............ | H01L/21/56 |
| JP | 8-222508 | 8/1996 | ......... | H01L/21/027 |
| WO | WO 90/06189 | 6/1990 | ............ | B08B/7/00 |
| WO | WO 90/13675 | 11/1990 | ............ | C22B/3/00 |
| WO | WO 93/14255 | 7/1993 | ............ | D06B/5/16 |
| WO | WO 93/14259 | 7/1993 | ............ | D06M/11/76 |
| WO | WO 93/20116 | 10/1993 | ............ | C08F/14/18 |
| WO | WO 96/27704 | 9/1996 | ............ | D06L/1/00 |
| WO | WO 99/49998 | 10/1999 | ............ | B08B/5/00 |
| WO | WO 00/73241 A1 | 12/2000 | ......... | C04B/35/622 |
| WO | WO 01/33613 A2 | 5/2001 | ............ | H01L/21/00 |
| WO | WO 02/09894 A2 | 2/2002 | | |
| WO | WO 02/11191 A2 | 2/2002 | ............ | H01L/21/00 |
| WO | WO 02/16051 A2 | 2/2002 | | |

OTHER PUBLICATIONS

"Supercritical Carbon Dioxide Resist Remover, SCORR, the Path to Least Photoresistance," Los Alamos National Laboratory, 1998.

Guan, Z. et al., "Fluorocarbon–Based Heterophase Polymeric Materials. 1. Block Copolymer Surfactants for Carbon Dioxide Applications," Macromolecules, vol. 27, 1994, pp 5527–5532.

International Journal of Environmentally Conscious Design & Manufacturing, vol. 2, No. 1, 1993, p. 83.

Matson and Smith "Supercritical Fluids" Journal of the American Ceramic Society, vol. 72, No. 6, pp. 872–874.

Ziger, D.H. et al., "Compound Fluid Technology: Application to RIE Developed Resists," AIChE Journal, vol. 33, No. 10, Oct. 1987, pp 1585–1591.

Kirk–Othmer, "Alcohol Fuels to Toxicology," Encyclopedia of Chemical Terminology, 3rd ed., Supplement Volume, New York: John Wiley & Sons, 1984, pp. 872–893.

"Cleaning with Supercritical $CO_2$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Takahashi, D., "Los Alamos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer–Protected Semiconductor Nanoparticles Through the Rapid Expansion of Supercritical Fluid Solution," Chemical Physics Letters, pp. 585–588, May 22, 1998.

Jackson, K. et al., "Surfactants and Microemulsions in Supercritical Fluids," Supercritical Fluid Cleaning. Noyes Publications, Westwood, NJ, pp. 87–120, Spring 1998.

Kryszewski, M., "Production of Metal and Semiconductor Nanoparticles in Polymer Systems," Polimery, pp. 65–73, Feb. 1998.

Bakker, G.L. et al., "Surface Cleaning and Carbonaceous Film Removal Using High Pressure, High Temperature Water, and Water/C02 Mixtures," J. Electrochem. Soc, vol. 145, No. 1, pp. 284–291, Jan. 1998.

Ober, C.K. et al., "Imaging Polymers with Supercritical Carbon Dioxide," Advanced Materials, vol. 9, No. 13, 1039–1043, Nov. 3, 1997.

Russick, E.M. et al., "Supercritical Carbon Dioxide Extraction of Solvent from Micro–machined Structures." Supercritical Fluids Extraction and Pollution Prevention, ACS Symposium Series, vol. 670, pp. 255–269, Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270–279, Oct. 21, 1997.

Wai, C.M., "Supercritical Fluid Extraction: Metals as Complexes," Journal of Chromatography A, vol. 785, pp. 369–383, Oct. 17, 1997.

Xu, C. et al., "Submicron–Sized Spherical Yttrium Oxide Based Phosphors Prepared by Supercritical CO2–Assisted aerosolization and pyrolysis," Appl. Phys. Lett., vol. 71, No. 12, Sep. 22, 1997, pp. 1643–1645.

Tomioka Y, et al., "Decomposition of Tetramethylammonium (TMA) in a Positive Photo–resist Developer by Supercritical Water," Abstracts of Papers 214$^{th}$ ACS Natl Meeting, American Chemical Society, Abstract No. 108, Sep. 7, 1997.

Klein, H. et al., "Cyclic Organic Carbonates Serve as Solvents and Reactive Diluents," Coatings World, pp. 38–40, May 1997.

Bühler, J. et al., Linear Array of Complementary Metal Oxide Semiconductor Double–Pass Metal Micro–mirrors, Opt. Eng., vol. 36, No. 5, pp 1391–1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343–348, Jan. 1997.

McClain, J.B. et al., "Design of Nonionic Surfactants for Supercritical Carbon Dioxide," Science, vol. 274, Dec. 20, 1996. pp. 2049–2052.

Znaidi, L. et al., "Batch and Semi–Continuous Synthesis of Magnesium Oxide Powders from Hydrolysis and Supercritical Treatment of Mg(OCH3)2," Materials Research Bulletin, vol. 31, No. 12, pp. 1527–1335, Dec. 1996.

Tadros, M.E., "Synthesis of Titanium Dioxide Particles in Supercritical CO2," J. Supercritical Fluids, vol. 9, pp. 172–176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539–2545, Aug. 1996.

Gabor, A, et al., "Block and Random Copolymer resists Designed for 193 nm Lithography and Environmentally Friendly Supercritical CO2 Development," SPIE, vol. 2724, pp. 410–417, Jun. 1996.

Schimek, G. L. et al., "Supercritical Ammonia Synthesis and Characterization of Four New Alkali Metal Silver Antimony Sulfides . . . ," J. Solid State Chemistry, vol. 123 pp. 277–284, May 1996.

Gallagher–Wetmore, P. et al., "Supercritical Fluid Processing: Opportunities for New Resist Materials and Processes," SPIE, vol. 2725, pp. 289–299, Apr. 1996.

Papathomas, K.I. et al., "Debonding of Photoresists by Organic Solvents," J. Applied Polymer Science, vol. 59, pp. 2029–2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991–1994.

Gloyna, E.F. et al., "Supercritical Water Oxidation Research and Development Update," Environmental Progress, vol. 14, No. 3, Pp. 182–192, Aug. 1995.

Gallagher–Wetmore, P. et al., "Supercritical Fluid Processing: A New Dry Technique for Photoresist Developing," SPIE vol. 2438, pp. 694–708, Jun. 1995.

Gabor, A. H. et al., "Silicon–Containing Block Copolymer Resist Materials," Microelectronics Technology—Polymers for Advanced Imaging and Packaging, ACS Symposium Series, vol. 614, pp. 281–298, Apr. 1995.

Tsiartas, P.C. et al., "Effect of Molecular weight Distribution on the Dissolution Properties of Novolac Blends," SPIE, vol. 2438, pp. 264–271, Jun. 1995.

Allen, R.D. et al., "Performance Properties of Near–monodisperse Novolak Resins,"SPIE, vol. 2438, pp. 250–260, Jun. 1995.

Wood, P.T. et al., "Synthesis of New Channeled Structures in Supercritical Amines . . . ," Inorg. Chem., vol. 33, pp. 1556–1558, 1994.

Jerome, J.E. et al., "Synthesis of New Low–Dimensional Quaternary Compounds. . . ," Inorg. Chem. vol. 33, pp. 1733–1734, 1994.

McHardy, J. et al., "Progress in Supercritical CO2 Cleaning," SAMPE Jour., vol. 29, No. 5, pp. 20–27, Sep. 1993.

Purtell, R. et al., "Precision Parts Cleaning using Supercritical Fluids," J. Vac, Sci, Technol. A. vol. 11, No. 4, Jul. 1993, pp. 1696–1701.

Bok, E, et al., "Supercritical Fluids for Single Wafer Cleaning," Solid State Technology, pp. 117–120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019–1022, 1992.

Hansen, B.N. et al., "Supercritical Fluid Transport—Chemical Deposition of Films,"Chem. Mater., vol. 4, No. 4, pp. 749–752, 1992.

Page, S.H. et al., "Predictability and Effect of Phase Behavior of CO2/Propylene Carbonate in Supercritical Chromatography," J. Microcol, vol. 3, No. 4, pp. 355–369, 1991.

Brokamp, T. et al., "Synthese und Kristallstruktur Eines Gemischtvalenten Lithium–Tantalnitrids Li2Ta3N5," J. Alloys and Compounds, vol. 176. pp. 47–60, 1991.

Hybertson, B.M. et al., "Deposition of Palladium Films by a Novel Supercritical Fluid Transport Chemical Deposition Process," Mat. Res. Bull., vol. 26, pp. 1127–1133, 1991.

Ziger, D. H. et al., "Compressed Fluid Technology: Application to RIE–Developed Resists," AiChE Jour., vol. 33, No. 10, pp. 1585–1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298–2306, 1987.

Tolley, W.K. et al., "Stripping Organics from Metal and Mineral Surfaces using Supercritical Fluids," Separation Science and Technology, vol. 22, pp. 1087–1101, 1987.

"Final Report on the Safety Assessment of Propylene Carbonate", J. American College of Toxicology, vol. 6, No. 1, pp. 23–51, 1987.

"Porous Xerogel Films as Ultra–Low Permittivity Dielectrics for ULSI Interconnect Applications", Materials Research Society, pp. 463–469, 1997.

Kawakami et al, "A Super Low–k (k=1.1) Silica Aerogel Film Using Supercritical Drying Technique", IEEE, pp. 143–145, 2000.

R.F. Reidy, "Effects of Supercritical Processing on Ultra Low–K Films", Texas Advanced Technology Program, Texas Instruments and the Texas Academy of Mathematics and Science.

Anthony Muscat, "Backend Processing Using Supercritical CO2," University of Arizona.

D. Goldfarb et al., "Aqueous–based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water–Rinsed Resist Systems", J. Vacuum Sci. Tech. B 18 (6), 3308(2000).

N. Sundararajan et al., "Supercritical CO2 Processing for Submicron Imaging of Fluoropolymers", Chem. Mater. 12, 41 (2000).

* cited by examiner

DRYING RESIST WITH A SOLVENT BATH AND SUPERCRITICAL $CO_2$

RELATED APPLICATIONS

This Patent Application claims priority under 35 U.S.C. §19(e) of the co-pending, co-owned U.S. Provisional Patent Application, Ser. No. 60/357,756, filed Feb. 15, 2002, entitled "DRYING RESIST WITH A SOLVENT BATH AND SUPERCRITICAL CO2, AND DEVELOPING RESIST WITH SUPERCRITICAL FLUID AND DISSOLVED TMAH," and the co-pending, co-owned U.S. Provisional Patent Application, Serial No. 60/358,622, filed Feb. 20, 2002, entitled "SUPERCRITICAL FLUID USED IN THE POST-DEVELOP RINSE," which are hereby incorporated by reference.

FIELD OF THE INVENTION

The present invention relates to the field of drying a polymeric film. More particularly, the present invention relates to the field of drying photoresist, without pattern collapse or deformation, using a solvent bath and supercritical carbon dioxide.

BACKGROUND OF THE INVENTION

Fabrication of integrated circuits includes the formation of patterned layers on a semiconductor wafer that form electrically active regions in and on the wafer surface. As part of the manufacturing process, a masking process referred to as photolithography or photomasking is used to transfer a pattern onto the wafer. Masking involves applying a photoreactive polymer or photoresist onto the wafer by any suitable means such as by spinning of the wafer to distribute liquid photoresist uniformly on its surface. In a typical semiconductor manufacturing process, several iterations of the masking process are employed. Layers of either positive or negative photoresist can be used in various combinations on the same wafer.

Typically, the wafer is heated or "soft baked" such as on a hot plate to improve adhesion of the photoresist to the substrate surface. A photo aligner aligns the wafer to the photomask and then portions of the photoresist coated wafer are exposed to high-energy light so that a pattern is formed as a latent image in the photoresist layer. A developing agent is then applied to develop the portions of the photoresist which were exposed. When positive resist is used, the developed portions of the resist are solubilized by the exposure to high-energy light. Conversely, when negative resist is used, the undeveloped portions of the resist are solubilized. Washing and rinsing steps are carried out that selectively remove the solubilized photoresist. A drying step is carried out.

In the fabrication of semiconductor devices, typically increases in operational speeds of integrated circuits parallel decreases in device feature sizes. As device feature sizes shrink, the thickness of the resist is constant while the width of the pattern decreases. This results in a higher aspect ratio of height to width of photoresist lines. In actual practice, as the aspect ratio increases, the mechanical stability of the resist lines decreases. A serious problem emerges when the mechanical stability of the resist lines is too weak to compensate for capillary forces exerted by the liquid during the drying step. During drying, unbalanced capillary forces exert a net force on the pattern that deforms the resist lines. When the capillary forces exceed the elastic restoring force of the polymer, collapse of the photoresist structure occurs.

The collapse of high-aspect-ratio photoresist structures is related to the surface tension of the rinse solution (capillary forces scale with the surface tension of the rinse solution) and is a function of both the density (spacing) and aspect ratio of resist lines. This becomes an increasingly serious problem as device feature sizes continue to shrink while relative vertical height increases to accommodate more complex interconnect structures.

As noted in the literature, collapse of photoresist structures is a generic term that refers to the deformation (bending), fracture, and/or peeling of resist from the substrate, in response to capillary forces present during the drying stage of a lithographic process. D. Goldfarb et. al, Aqueous-Based Photoresist Drying Using Supercritical Carbon Dioxide to Prevent Pattern Collapse, J. Vacuum Sci. Tech. B 18(6), 3313 (2000). Several parameters have been identified which influence the pattern collapse behavior, e.g., the mechanical stiffness of the resist lines are dominated by the Young's modulus (the force per unit cross section of a given substance divided by the fractional increase in length resulting from the stretching of a standard rod or wire of the substance). In addition, due to the different resist chemistries of various vendors, there are different critical aspect ratios of collapse.

A variety of strategies to overcome some of the issues bearing on pattern collapse are published. Conceptually speaking, the simplest method to reduce pattern collapse is to reduce the resist film thickness. However, this method is beginning to show the fundamental limits of the materials constituting the polymeric film. Instead of decreasing the film thickness, a different strategy could be to increase the resist stiffness such as by resist heating during rinsing to harden the resist structures, in order to eliminate or minimize collapse. Another strategy could be to use a supercritical fluid to dry resist patterns after rinsing. Supercritical fluids are characterized by high solvating and solubilizing properties that are typically associated with compositions in the liquid state. Supercritical fluids also have a low viscosity that is characteristic of compositions in the gaseous state. The conventional supercritical fluid drying methods commonly employ alcohol, e.g., ethanol, for rinsing. The ethanol rinse liquid can be directly replaced with carbon dioxide ($CO_2$). However, a strategy of using conventional supercritical fluid drying methods to dry resist patterns would have to overcome the additional problem of water contamination. Typically, resist systems are designed to employ aqueous-based developers and, for some resist systems, water is used for rinsing, for example, after development in an aqueous solution of tetramethyl ammonium hydroxide (TMAH). Moreover, polar organic compounds such as ethanol employed in conventional supercritical drying can not be used to dry water-rinsed resists because they dissolve the resist. When water is used for rinsing, e.g., for resists developed in an aqueous solution of TMAH, the presence of moisture in the atmosphere can not be avoided. This presents a serious problem because moisture in the atmosphere can cause acrylate-type resist to swell and pattern deformation can occur.

The impetus for the recent explorations of supercritical fluid to dry resist patterns is the philosophy that pattern collapse can be minimized by reducing the surface tension of the rinse solution. It is commonly known that one of the mechanisms of pattern collapse is the presence of capillary forces. Moreover, it is known that capillary forces scale with the surface tension of the rinse solution. In mathematical terms, the Laplace equation $F=\gamma/r$ relates the force (F) acting on the resist walls to the surface tension ($\gamma$) of the rinse liquid and the radius (r) of the meniscus in between the patterns. By the equation, decreases in the surface tension relate to decreases in the capillary force acting on the resist walls. D. Goldfarb et. al, Aqueous-Based Photoresist Drying Using Supercritical Carbon Dioxide to Prevent Pattern Collapse, J. Vacuum Sci. Tech. B 18(6), 3313 (2000). Accordingly, there is a need for effective methods for supercritical resist drying to eliminate or minimize the capillary forces present during resist drying.

Two methods of supercritical resist drying using $CO_2$ that were developed for water-rinsed resist patterns are described in H. Namatsu et al., J. Vacuum Sci. Tech. B 18(6), 3308 (2000) (hereinafter, "Namatsu"). As stated in Namatsu, supercritical resist drying in principle should not generate any surface tension. This is because, in the phase diagram for the drying process, the phase does not cross the liquid-vapor equilibrium curve; and consequently, there is no liquid-gas interface where surface tension could be generated. Namatsu, citing, H. Namatsu et al., J. Microelectron. Eng., 46, 129 (1998), and H. Namatsu et al., J. Vacuum Sci. Tech. B 18(2), 780 (2000). In the first method as described in Namatsu, a solution of n-hexane, a $CO_2$-philic liquid (in terms of their solubility in $CO_2$, polymers have been classified as $CO_2$-philic and $CO_2$-phobic) and a surfactant, sorbitan fatty acid ether, first replaces the water and, in turn, is replaced with liquid $CO_2$ before supercritical resist drying (SRD) is performed. In this method, the addition of a compound with a high hydrophilic-lipophilic balance to the surfactant compensates for the poor miscibility of water in a solution of n-hexane and sorbitan fatty acid ether. In the second method, which does not require a $CO_2$-philic liquid, the water is replaced directly with the liquid $CO_2$ containing a surfactant, fluoroether carboxylate, which makes water miscible in $CO_2$, and then SRD is performed.

One disadvantage of the supercritical resist drying methods set forth in Namatsu is that their effectiveness is based on the use of a surfactant to enable rinse water to be replaced with $CO_2$ before the drying step is carried out, resulting in additional chemicals other than $CO_2$ needed for the process. Certain surfactants can dissolve the resist patterns, while various other surfactants can result in the formation of a haze on the surface of the photoresist.

There is a need for effective methods for supercritical resist drying to dry semiconductor wafers with no pattern collapse of the photoresist.

SUMMARY OF THE INVENTION

A first embodiment of the present invention is for a method of drying an object, having a polymeric film, wherein the object is submerged in a rinse liquid. The object is removed from the rinse liquid and the object is placed in a solvent bath before a sufficient amount of the rinse liquid can evaporate from the object. The density of a solvent in the solvent bath depends on a direction of orientation of the polymeric film with respect to a force (e.g., force of gravity or centripetal force). The object is removed from the solvent bath. A drying process is performed.

A second embodiment of the invention is for a method of drying an object having a polymeric film. A sufficient quantity of rinse liquid is maintained on top of the polymeric film while moving the object from a rinse bath to a solvent bath. The object is placed in the solvent bath. The density of a solvent in the solvent bath depends on a direction of orientation of the polymeric film with respect to a force. The object is removed from the solvent bath. A supercritical fluid drying process is performed.

A third embodiment is for an apparatus for drying an object having a polymeric film including: a rinse bath; a solvent bath; means for maintaining a sufficient quantity of rinse liquid on top of the polymeric film while moving the object from the rinse bath to the solvent bath; means for placing the object in the solvent bath; means for removing the object from the solvent bath; and means for performing a supercritical fluid drying process.

BRIEF DESCRIPTION OF THE DRAWINGS

The present invention may be better understood by reference to the accompanying drawings of which.

DETAILED DESCRIPTION OF THE PREFERRED EMBODIMENTS

The following detailed description with reference to the accompanying drawing is illustrative of various embodiments of the invention. The present invention should not be construed as limited to the embodiments set forth herein. Therefore, the following detailed description is not to be taken in a limiting sense, and the scope of the present invention is defined by the accompanying claims.

The present invention is directed to a process of drying an object having a polymeric film, such as a semiconductor substrate or wafer that has been fabricated in accordance with methods well known in the art of manufacturing semiconductor devices. The methods and apparatus in accordance with the present invention utilize the low viscosity and high solvating and solubilizing properties of supercritical carbon dioxide to assist in the cleaning process.

For purposes of the invention, "carbon dioxide" should be understood to refer to carbon dioxide ($CO_2$) employed as a fluid in a liquid, gaseous or supercritical (including near-supercritical) state. "Liquid carbon dioxide" refers to $CO_2$ at vapor-liquid equilibrium conditions. If liquid $CO_2$ is used, the temperature employed is preferably below 31.1° C. "Supercritical carbon dioxide" refers herein to $CO_2$ at conditions above the critical temperature (31.1° C.) and critical pressure (1070.4 psi). When $CO_2$ is subjected to temperatures and pressures above 31° C. and 1070.4 psi, respectively, it is determined to be in the supercritical state. "Near-supercritical carbon dioxide" refers to $CO_2$ within about 85% of absolute critical temperature and critical pressure.

Various objects can be dried using the processes of the present invention such as semiconductor wafers, substrates, and other media requiring photoresist drying. The present invention, though applicable to the semiconductor industry, is not limited thereto. For the purposes of the invention, "drying" should be understood to be consistent with its conventional meaning in the art.

As used herein, "substrate" includes a wide variety of structures such as semiconductor device structures with a deposited photoresist. A substrate can be a single layer of material, such as a silicon wafer, or can include any number of layers. A substrate can be comprised of various materials, including metals, ceramics, glass, or compositions thereof.

Figure 1:
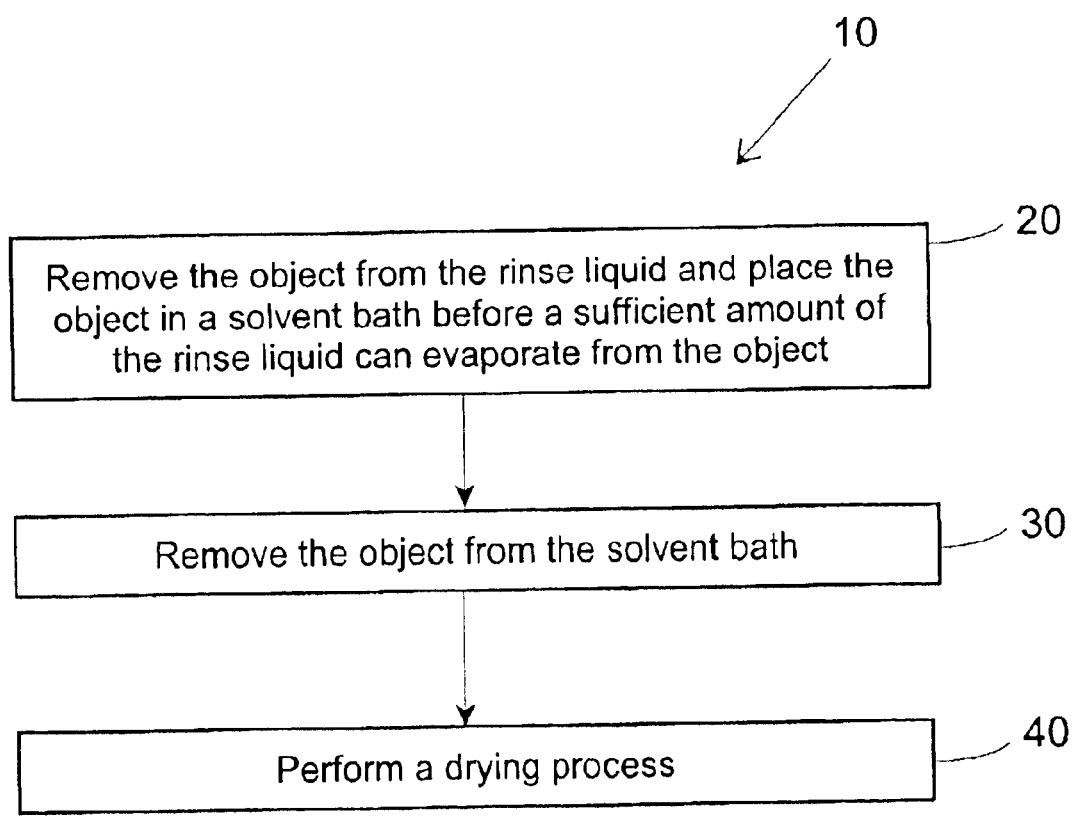
FIG. 1 is a flow chart showing a process flow for a method of drying an object having a polymeric film, wherein the object is submerged in a rinse liquid, in accordance with the present invention.

FIG. 1 is a flow chart showing a process flow (10) for a method of drying an object having a polymeric film, wherein the object is submerged in a rinse liquid. For purposes of the invention, "object" includes: a substrate consisting of metals, ceramics, glass, and composite mixtures thereof, a semiconductor wafer for forming integrated circuits; and other objects requiring photoresist drying. It should be appreciated that the surface of the object, or at least a portion thereof, is coated with a polymeric film such as photoresist.

In a preferred embodiment of the invention, the object is removed from the rinse liquid and placed in a solvent bath before a sufficient amount of the rinse liquid can evaporate from the object (20). It should be understood that "before a sufficient amount of the rinse liquid can evaporate from the object" means before the process of evaporation results in capillary forces that exert a net force on the pattern that deforms the resist lines. In one embodiment of the invention, the rinse liquid is water.

Preferably, the density of the solvent depends on the direction of orientation of the polymeric film with respect to a force, such as the force of gravity. Where an even greater force is desired, the object being dried can be placed into a centrifuge and force is a combination of gravity and a centripetal force. For example, in one embodiment, when the polymeric film is oriented in a direction that is opposite, or nearly opposite, to the direction of the force exerted on the object, a solvent is selected such that the density of the solvent is greater than the density of the rinse liquid. In an alternative embodiment, when the polymeric film is oriented in a direction that is the same, or nearly the same, as the direction of the force exerted on the object, a solvent is selected such that the density of the solvent is less than the density of the rinse liquid. Examples of solvents that can be used in the present invention include, but are not limited to, alkyl ethers R—O—$R_1$, where R=aliphatic hydrocarbons $C_1$–$C_6$ or $R_1$=fluorinated hydrocarbons $C_1$–$C_6$, such as ethyl nonafluoroisobutyl ether and ethyl nonafluorobutyl ether, available under the product name HFE-7200 and other product names such as HFE-7100, from 3M Company, St. Paul, Minn. 55144.

In one embodiment, the solvent includes a co-solvent and/or a surfactant. Examples of co-solvents that can be used in the present invention include, but are not limited to, aliphatic and aromatic hydrocarbons, and esters and ethers thereof, particularly mono and di-esters and ethers, alkyl and dialkyl carbonates, alkylene and polyalkylene glycols, and ethers and esters thereof, lactones, alcohols and diols, polydimethylsiloxanes, DMSO, and DMF. Examples of surfactants that can be used in the invention include, but are not limited to, anionic, cationic, nonionic, fluorinated and non-fluorinated surfactants.

In a preferred embodiment of the invention, the object is removed from the solvent bath (30) and a drying process is performed (40). Preferably, the drying process is a supercritical fluid drying process. In a supercritical fluid drying process the surface tension vanishes in the supercritical phase, which means that capillary forces are zero in the supercritical phase. Preferably, carbon dioxide is used as the fluid in the supercritical fluid drying process. The advantages of using carbon dioxide in the supercritical fluid drying process include that the critical point is relatively low, it is relatively inexpensive, is nontoxic, is chemically inert to various photoresists, and can solubilize organic solvents at moderate pressures. However, it should be understood that the methods and apparatus of the present invention are not limited to the use of carbon dioxide as the fluid in the supercritical fluid drying process. In one embodiment, the supercritical fluid drying process includes a spin dry process.

Figure 2:
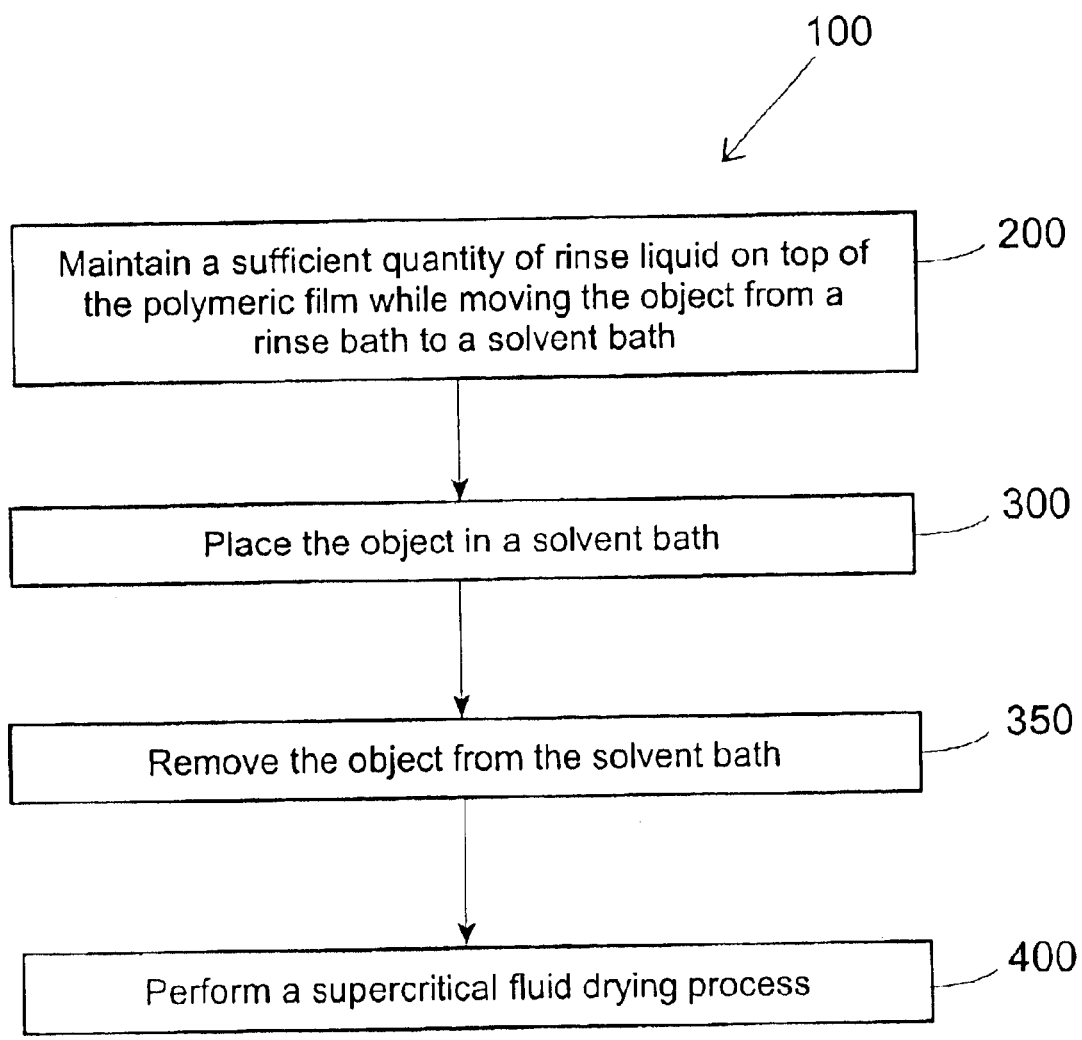
FIG. 2 is a flow chart showing a process flow for a method of drying an object having a polymeric film in accordance with the present invention.

FIG. 2 is a flow chart showing a process flow (100) for a method of drying an object having a polymeric film. In one preferred embodiment of the present invention, a sufficient quantity of rinse liquid is maintained on top of the polymeric film while moving the object from a rinse bath to a solvent bath (200). For the purposes of the invention, "a sufficient quantity of rinse liquid" means a quantity of rinse liquid such that evaporation of the rinse liquid, while moving the object from a rinse bath to a solvent bath, does not result in capillary forces of sufficient magnitude to deform the resist lines. In one embodiment of the invention, the rinse liquid is water.

The object is placed in a solvent bath (300). In one preferred embodiment, the density of the solvent depends on the direction of orientation of the polymeric film with respect to a force, such as force of gravity or centripetal force. In one embodiment, when the polymeric film is oriented in a direction that is opposite, or nearly opposite, to the direction of the force exerted on the object, a solvent is selected such that the density of the solvent is greater than the density of the rinse liquid. In another embodiment, when the polymeric film is oriented in a direction that is the same, or nearly the same, as the direction of the force exerted on the object, a solvent is selected such that the density of the solvent is less than the density of the rinse liquid.

In a preferred embodiment of the invention, the object is removed from the solvent bath (350) and a supercritical fluid drying process is performed (400).

Figure 3:
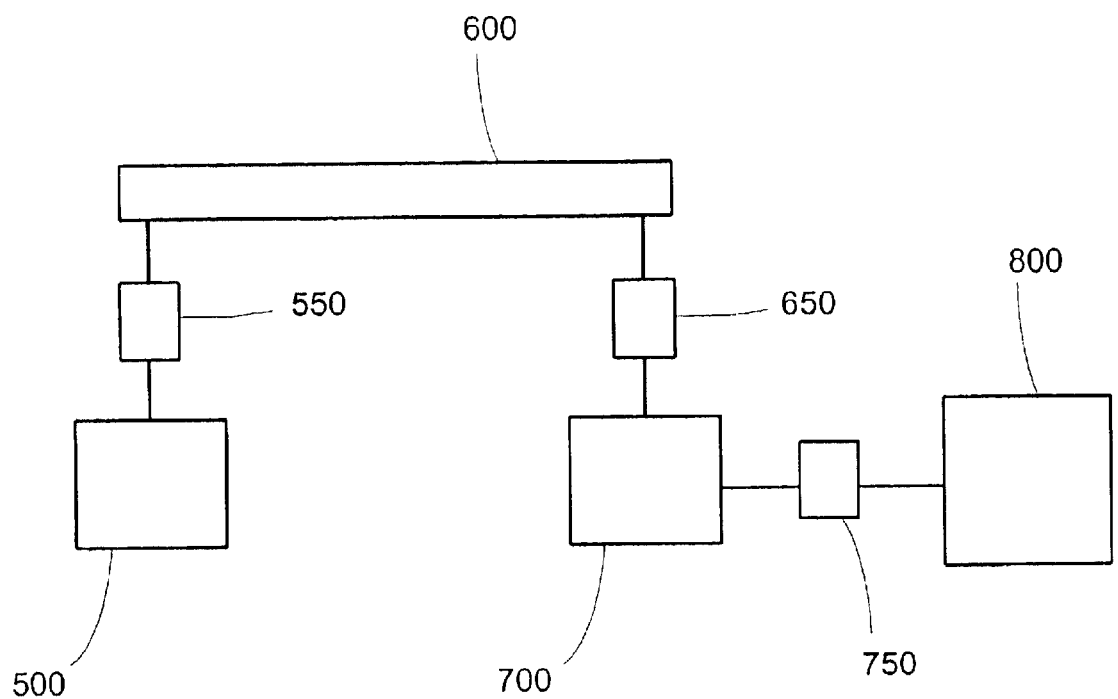
FIG. 3 is a schematic illustration of an apparatus for drying an object having a polymeric film in accordance with the present invention.

FIG. 3 is a schematic illustration of an apparatus for drying an object having a polymeric film, that includes both a rinse bath (500) and a solvent bath (700). There is means for removing the object (550) from the rinse bath (500), such as a robotic arm or operator using a wafer wand. A means for maintaining a sufficient quantity of rinse liquid on top of the polymeric film while moving the object (600) from the rinse bath (500) to the solvent bath (700), such as a rinse liquid flow, is provided. There is means for placing the object (650) in the solvent bath (700) such as a robotic arm or operator using a wafer wand. There is means for removing the object (750) from the solvent bath (700), such as a robotic arm or operator using a wafer wand. It should be understood that means (550), (650) and (750), although depicted as separate means in FIG. 3, can be the same means, such as the same robotic arm or operator using a wafer wand.

A means for performing a supercritical fluid drying process (800), such as a pressure chamber, is provided. The details concerning one example of a pressure chamber for supercritical processing are disclosed in co-owned and co-pending U.S. patent applications, Ser. No. 09/912,844, entitled "HIGH PRESSURE PROCESSING CHAMBER FOR SEMICONDUCTOR SUBSTRATE," filed Jul. 24, 2001, and Ser. No. 09/970,309, entitled "HIGH PRESSURE PROCESSING CHAMBER FOR MULTIPLE SEMICONDUCTOR SUBSTRATES," filed Oct. 3, 2001, which are incorporated by reference.

While the processes and apparatuses of this invention have been described in detail for the purpose of illustration, the inventive processes and apparatuses are not to be construed as limited thereby. It will be readily apparent to those of reasonable skill in the art that various modifications to the foregoing preferred embodiments can be made without departing from the spirit and scope of the invention as defined by the appended claims.

What is claimed is:

1. A method of drying an object, having a polymeric film, wherein the object is submerged in a rinse liquid, comprising the steps of:
    a. removing the object from the rinse liquid and placing the object in a solvent bath before a sufficient amount of the rinse liquid can evaporate from the object, wherein the density of a solvent in the solvent bath depends on a direction of orientation of the polymeric film with respect to a force;
    b. removing the object from the solvent bath; and
    c. performing a drying process.

2. The method of claim 1 wherein the object is a semiconductor wafer for forming integrated circuits.

3. The method of claim 1 wherein the polymeric film is a photoresist film.

4. The method of claim 1 wherein the rinse liquid is water.

5. The method of claim 1 wherein the solvent includes at least one of a co-solvent and a surfactant.

6. The method of claim 1 wherein the force comprises at least one of force of gravity and centripetal force.

7. The method of claim 6 wherein the density of the solvent depends on a direction of orientation of the polymeric film with respect to the force comprises the density of the solvent is greater than the density of the rinse liquid when the polymeric film is oriented in an essentially opposite direction with respect to the force.

8. The method of claim 6 wherein the density of the solvent depends on a direction of orientation of the polymeric film with respect to the force comprises the density of the solvent is less than the density of the rinse liquid when the polymeric film is oriented in an essentially same direction with respect to the force.

9. The method of claim 1 wherein performing the drying process comprises performing a supercritical fluid drying process.

10. The method of claim 9 wherein performing the supercritical fluid drying process includes spinning the object.

11. A method of drying an object having a polymeric film comprising the steps of:
    a. maintaining a sufficient quantity of rinse liquid on top of the polymeric film while moving the object from a rinse bath to a solvent bath;
    b. placing the object in the solvent bath, wherein the density of a solvent in the solvent bath depends on a direction of orientation of the polymeric film with respect to a force;
    c. removing the object from the solvent bath; and
    d. performing a supercritical fluid drying process.

12. The method of claim 11 wherein the object is a semiconductor wafer for forming integrated circuits.

13. The method of claim 11 wherein the polymeric film is a photoresist film.

14. The method of claim 11 wherein the rinse liquid is water.

15. The method of claim 11 wherein the solvent includes at least one of a co-solvent and a surfactant.

16. The method of claim 11 wherein the force comprises at least one of force of gravity and centripetal force.

17. The method of claim 16 wherein the density of the solvent depends on a direction of orientation of the polymeric film with respect to the force comprises the density of the solvent is greater than the density of the rinse liquid when the polymeric film is oriented in an essentially opposite direction with respect to the force.

18. The method of claim 16 wherein the density of the solvent depends on a direction of orientation of the polymeric film with respect to the force comprises the density of the solvent is less than the density of the rinse liquid when the polymeric film is oriented in an essentially same direction with respect to the force.

19. The method of claim 11 wherein performing the supercritical fluid drying process includes spinning the object.

20. An apparatus for drying an object having a polymeric film comprising:
    a. a rinse bath;
    b. a solvent bath;
    c. means for maintaining a sufficient quantity of rinse liquid on top of the polymeric film while moving the object from the rinse bath to the solvent bath;
    d. means for placing the object in the solvent bath;
    e. means for removing the object from the solvent bath; and
    f. means for performing a supercricital fluid drying process.

21. The method of claim 1, wherein the solvent bath comprises an alkyl ether R—O—$R_1$, wherein R is an aliphatic hydrocarbon $C_1$–$C_6$ and $R_1$ is a fluorinated hydrocarbon $C_1$–$C_6$.

22. The method of claim 21, wherein $C_1$–$C_6$ is a hydrocarbon selected from the group consisting of ethyl nonafluoroisobuty ether and ethyl nonafluorobutyl ether.

23. The apparatus of claim 20, wherein the rinse bath comprises water.

24. The apparatus of claim 21, wherein the solvent bath comprises at least one of a co-solvent and a surfactant.

25. The apparatus of claim 20, wherein the solvent bath comprises an alkyl ether R—O—$R_1$, wherein R is an aliphatic hydrocarbon $C_1$–$C_6$ and $R_1$ is a fluorinated hydrocarbon $C_1$–$C_6$.

26. The method of claim 25, wherein $C_1$–$C_6$ is a hydrocarbon selected from the group consisting of ethyl nonafluoroisobutyl ether and ethyl nonafluorobutyl ether.

* * * * *

UNITED STATES PATENT AND TRADEMARK OFFICE
CERTIFICATE OF CORRECTION

PATENT NO. : 6,928,746 B2
DATED : August 16, 2005
INVENTOR(S) : Chantal J. Arena-Foster et al.

It is certified that error appears in the above-identified patent and that said Letters Patent is hereby corrected as shown below:

Title page,
Item [56], References Cited, U.S. PATENT DOCUMENTS, insert:
-- 6,001,133    12/1999    DeYoung et al.
6,486,282 B1    11/2002    Dammel et al. --.

Column 8,
Lines 40-42, delete "22. The method of claim 21, wherein $C_1$–$C_6$ is a hydrocarbon selected from the group consisting of ethyl nonafluoroisobuty ether and ethyl nonafluorobutyl ether."
add -- 22. The method of claim 21, wherein $C_1$–$C_6$ is a hydrocarbon selected from the group consisting of ethyl nonafluoroisobutyl ether and ethyl nonafluorobutyl ether. --.

Signed and Sealed this

Fourth Day of October, 2005

JON W. DUDAS
*Director of the United States Patent and Trademark Office*